(12) United States Patent
Kim et al.

(10) Patent No.: US 11,183,460 B2
(45) Date of Patent: Nov. 23, 2021

(54) EMBEDDED DIE PACKAGING WITH INTEGRATED CERAMIC SUBSTRATE

(71) Applicant: Texas Instruments Incorporated, Dallas, TX (US)

(72) Inventors: Woochan Kim, Sunnyvale, CA (US); Mutsumi Masumoto, Oita (JP); Kengo Aoya, Oita (JP); Vivek Kishorechand Arora, San Jose, CA (US); Anindya Poddar, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/132,906

(22) Filed: Sep. 17, 2018

(65) Prior Publication Data

US 2020/0091076 A1    Mar. 19, 2020

(51) Int. Cl.
| | |
|---|---|
| *H01L 23/538* | (2006.01) |
| *H01L 23/373* | (2006.01) |
| *H01L 21/56* | (2006.01) |
| *H01L 23/498* | (2006.01) |

(52) U.S. Cl.
CPC ........ *H01L 23/5389* (2013.01); *H01L 21/568* (2013.01); *H01L 23/3735* (2013.01); *H01L 23/49861* (2013.01)

(58) Field of Classification Search
CPC ............. H01L 23/5389; H01L 23/3735; H01L 23/49861
See application file for complete search history.

(56) References Cited

U.S. PATENT DOCUMENTS

| | | | |
|---|---|---|---|
| 8,450,151 B1 | 5/2013 | Poddar et al. | |
| 8,716,830 B2 | 5/2014 | Poddar et al. | |
| 9,099,454 B2 | 8/2015 | Wachter et al. | |
| 9,663,357 B2 | 5/2017 | Mao et al. | |
| 2010/0237511 A1 | 9/2010 | Masumoto | |
| 2011/0109287 A1* | 5/2011 | Nakamura | H01L 23/3107 323/282 |
| 2012/0106086 A1* | 5/2012 | Schloerke | H01L 25/072 361/715 |
| 2013/0009298 A1* | 1/2013 | Ota | H01L 23/3735 257/676 |
| 2013/0082383 A1 | 4/2013 | Aoya | |
| 2013/0093067 A1 | 4/2013 | Clark et al. | |
| 2013/0154088 A1 | 6/2013 | Cable et al. | |
| 2013/0161801 A1* | 6/2013 | Otremba | H01L 23/24 257/668 |

(Continued)

*Primary Examiner* — Peniel M Gumedzoe
(74) *Attorney, Agent, or Firm* — Ronald O. Neerings; Charles A. Brill; Frank D. Cimino

(57) ABSTRACT

Packaged electronic devices and integrated circuits include a ceramic material or other thermally conductive, electrically insulating substrate with a patterned electrically conductive feature on a first side, and an electrically conductive layer on a second side. The IC further includes a semiconductor die mounted to the substrate, the semiconductor die including an electrically conductive contact structure, and an electronic component, with an electrically insulating lamination structure enclosing the semiconductor die, the frame and the thermal transfer structure. A redistribution layer with a conductive structure is electrically connected to the electrically conductive contact structure.

22 Claims, 9 Drawing Sheets

(56) References Cited

U.S. PATENT DOCUMENTS

| | | | |
|---|---|---|---|
| 2013/0241040 A1* | 9/2013 | Tojo | H01L 23/49844 |
| | | | 257/666 |
| 2013/0244382 A1 | 9/2013 | Clark | |
| 2015/0003000 A1 | 1/2015 | Manepalli et al. | |
| 2015/0008566 A1 | 1/2015 | Gerber et al. | |
| 2015/0143690 A1 | 5/2015 | Poddar | |
| 2015/0147845 A1 | 5/2015 | Poddar et al. | |
| 2015/0155267 A1* | 6/2015 | Hoegerl | H01L 25/0655 |
| | | | 257/698 |
| 2015/0255380 A1* | 9/2015 | Chen | H01L 23/49568 |
| | | | 361/707 |
| 2015/0303164 A1* | 10/2015 | Chen | H01L 24/32 |
| | | | 361/720 |
| 2016/0005705 A1 | 1/2016 | Masumoto | |
| 2016/0352246 A1* | 12/2016 | Lai | H02M 7/003 |
| 2017/0110978 A1* | 4/2017 | Lai | H01L 23/36 |

\* cited by examiner

EMBEDDED DIE PACKAGING WITH INTEGRATED CERAMIC SUBSTRATE

BACKGROUND

Integrated circuits and packaged electronic devices are often produced from a semiconductor-based die or chip with one or more electronic components. Various packaging types are available, including SMT packages with chip contacts wire-bonded to a leadframe and flip-chip ball grid array (FC-BGA) devices with a die mounted to a substrate, such as a printed circuit board (PCB), which in turn has conductive pads or balls for soldering to a user circuit board. Embedded die packaging processes provide advantages in high-voltage, high power density applications, sometimes using plated copper structures to replace bond wires or solder bumps and suppresses package inductance to facilitate high switching frequency operation. The die temperature can be controlled using a heat spreader, such as copper directly plated on the die that connects the die to an external heat sink. However, thermal cycling or surface mount processing can mechanically stress the die, and lead to die cracking, due to a coefficient of thermal expansion (CTE) mismatch between the copper and the die. Inserting a copper post array between the die and the heat spreader requires extra processing and cost and inhibits heat dissipation.

SUMMARY

Described examples provide packaged electronic devices and integrated circuits with a ceramic or other thermally conductive, electrically insulating substrate. The device also includes a semiconductor die mounted to the substrate, and an electrically insulating lamination structure that encloses a portion of the semiconductor die and a portion of the electrically insulating, thermally conductive substrate. A heat sink can be mounted to the thermally conductive, electrically insulating substrate to draw heat away from the semiconductor die. The thermally conductive, electrically insulating substrate in one example provides a coefficient of thermal expansion (CTE) sufficiently close to that of the die to mitigate or avoid mechanical stress to the die and resulting die cracking during thermal cycling or surface mount processing. In one example, the device also includes a redistribution layer with a conductive structure electrically connected to the electrically conductive contact structure.

Example methods include attaching a semiconductor die to a conductive feature on an electrically insulating, thermally conductive substrate, and forming an electrically insulating lamination structure to enclose a portion of the semiconductor die, and a portion of the electrically insulating substrate. In one example, the electrically insulating, thermally conductive substrate includes a ceramic material. In one example, the method includes attaching the die and a frame to a carrier structure, such as an adhesive tape, forming the electrically insulating lamination structure to enclose portions of the frame and the portions of the semiconductor die and the electrically insulating substrate, and removing the carrier structure after forming the electrically insulating lamination structure. The method in one example also includes forming a redistribution layer (RDL) structure with a conductive structure electrically connected to an electrically conductive contact structure of the semiconductor die, and mounting a heat sink to the electrically insulating substrate.

DETAILED DESCRIPTION

Figure 1:
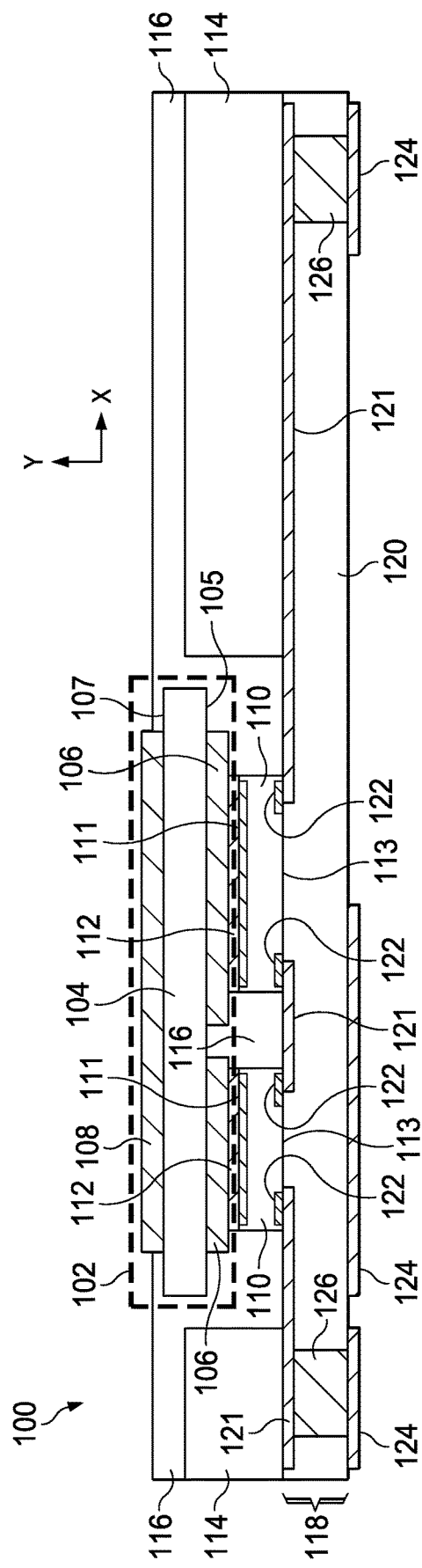
FIG. 1 is a partial sectional side elevation view of an integrated circuit packaged microelectronic device with a ceramic substrate to transfer heat from a tope side of a semiconductor die and a redistribution layer structure to provide connection to an electronic component of the die.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a packaged electronic device 100. In one example, the device 100 is an integrated circuit (IC) with multiple interconnected electronic components. In another example, the packaged electronic device 100 includes a single electronic component. The packaged electronic device 100 includes a thermal transfer structure 102 with an electrically insulating, thermally conductive substrate 104. In one example, the substrate 104 includes a ceramic material, such as one or more of aluminum oxide (e.g., $Al_2O_3$, Alumina), aluminum nitride (AlN), silicon nitride ($Si_3N_4$), fired or sintered zirconia ceramic (e.g., CZ6, CZ8, CZ9, AZ-25, AZ-67, AZ-93, CZR, $CZR_y$, ZTA, ZTA-A3, ZTA-90, and/or zirconia toughened alumina (e.g., ZTA, ZTA-02, ZTA-14, ZTA-20). The substrate 104 has a first side 105 (e.g., the bottom side in FIG. 1) with an electrically conductive feature 106, and a second (e.g., top) side 107 with an electrically conductive layer 108. In one example, the first side 105 includes multiple patterned conductive features 106, although not a requirement of all possible implementations. In one example, the electrically conductive feature (s) 106 and the electrically conductive layer 108 are copper plated on the respective sides 105 and 107 of the substrate 104, and patterned using masked etching or other suitable patterning processing. In the illustrated example, moreover, the conductive feature or features 106 provide electrical interconnection with electronic circuitry of one or more semiconductor dies of the device 100, while the electrically conductive layer 108 can be attached to an external heat sink using a thermal interface material (e.g., solder, thermal grease, gap pad, etc., not shown in FIG. 1) to facilitate cooling of one or more semiconductor dies of the device 100.

The packaged electronic device 100 in FIG. 1 also includes semiconductor dies 110. In the illustrated example, the device 100 includes two semiconductor dies 110. In other examples, the device 100 can include a single semiconductor die 110. As discussed further below in connection with FIG. 13, the semiconductor die 110 in one example includes one or more electronic components. In the illustrated example, the individual dies 110 each include a first side 111 (e.g., a top side) that is mounted to the electrically conductive feature 106 on the first side 105 of the substrate 104, as well as a second (e.g., bottom) side 113 with an electrically conductive contact structure 122. In one example, the first side 111 of the die 110 includes one or more conductive features that is/are soldered to the electrically conductive feature 106 via solder 112. In one example, moreover, the electrically conductive contact structure 122 of the die 110 is electrically connected to one or more electronic components of the die 110. The conductive contact structure 122 in one example is a conductive feature of a metallization structure fabricated on a semiconductor substrate to provide electrical interconnection to one or more electronic components formed on and/or in the semiconductor substrate as illustrated and described further below in connection with FIG. 13. In addition, the die 110 can include a conductive structure on the first side 111 to facilitate soldering to the conductive feature 106 of the thermal transfer structure 102. In one example, this provides a thermal cooling channel for removing heat from one or more electronic components of the die 110 via the thermal transfer structure 102.

The device 100 of FIG. 1 also includes a frame 114, and an electrically insulating lamination structure 116 that encloses at least a portion of the semiconductor die 110, as well as a portion of the frame 114, and a portion of the thermal transfer structure 102. The frame 114 can be any suitable material, such as a FR4, to provide mechanical rigidity and support for the assembled packaged device 100. In one example, the conductive contact structure 122 is a pad on die 110 for electrical interconnection. In one embedded die package example, the conductive contact structure 122 is a thin copper seed layer suitable for subsequent plating processing to plate-up a copper feature 121 of a redistribution layer (RDL) structure 118 in FIG. 1.

In the illustrated example, the packaged electronic device 100 further includes the RDL structure 118 to provide electrical connectivity between the conductive contact structure or structures 122 of the die or dies 110 and a user system (not shown). The example redistribution layer structure 118 in FIG. 1 includes an electrically insulating isolation material 120, as well as one or more conductive structures 121, 124, 126 that are electrically connected to the conductive contact structure 122.

The conductive structures in the example RDL structure 118 in FIG. 1 include top plated copper features (e.g., traces) 121, plated onto portions of the conductive contact structure or structures 122 on the lower side of the dies 110. The RDL structure 118 also includes conductive vias or plated thru holes 126 that extend between the top and bottom sides of the isolation material 120 and provide electrical connection of at least some of the top side conductive contact structures 122 to bottom side conductive contact structures 124. In one example, the conductive structures 121, 124, 126 are plated copper or aluminum. In one implementation, the bottom side conductive contact structures 124 are capable of being soldered to a user printed circuit board (not shown) to electrically connect circuitry of the die or dies 110 to a host circuit.

Figure 2:
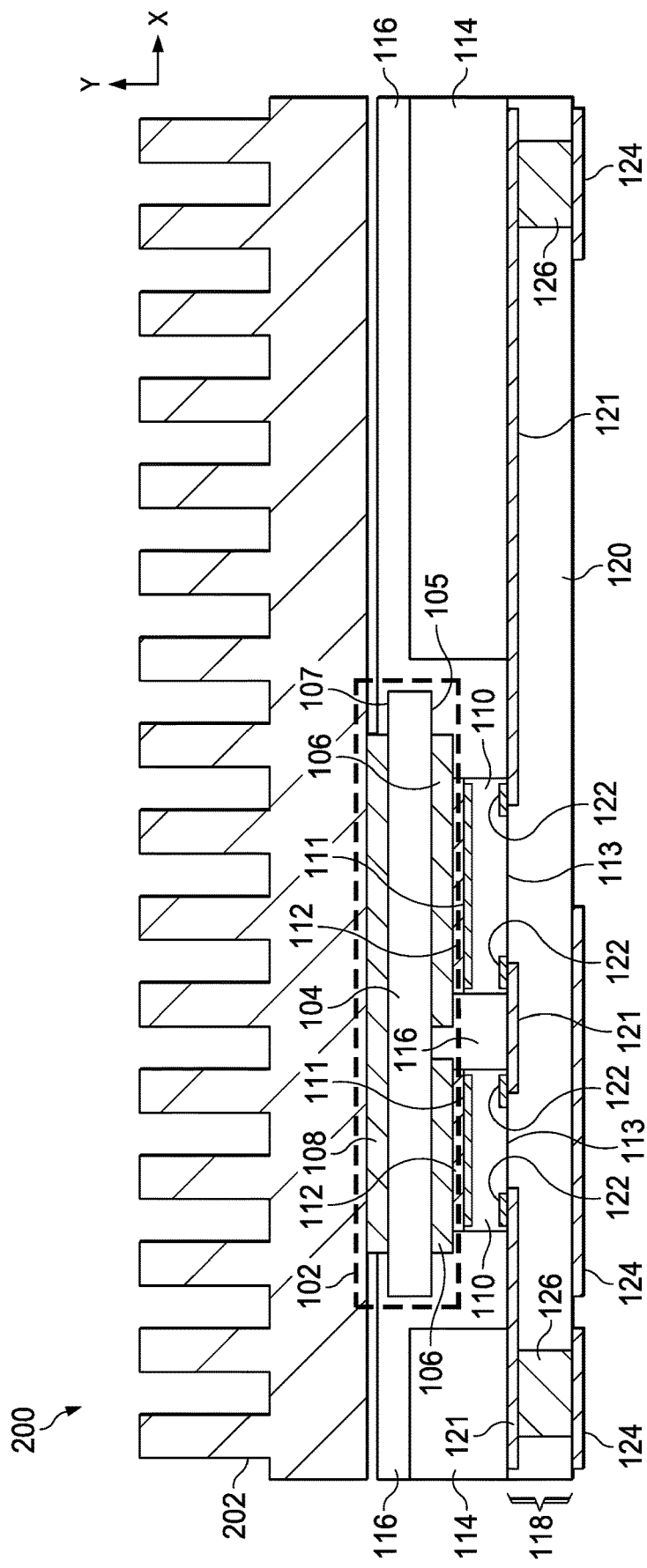
FIG. 2 is a partial sectional side elevation view of another integrated circuit packaged microelectronic device with a heat sink mounted to the ceramic substrate.

FIG. 2 shows another integrated circuit packaged microelectronic device 200 that includes a thermal transfer structure 102, first and second semiconductor dies 110, a frame 114, an RDL structure 118, and an electrically insulating lamination structure 116 as described above in the device 100 of FIG. 1. The packaged device 200 in FIG. 2 also includes a heat sink 202 mounted to the electrically conductive layer 108 of the thermal transfer structure 102. In this example, the heat sink 202 helps draw heat away from the dies 110 through the thermally conductive substrate 104 to enhance power density in the device 200. In this regard, directly coupled copper heat spreader structures have a coefficient of thermal expansion (CTE) of approximately 16, whereas the CTE of a semiconductor substrate of the die 110 is typically much lower (e.g., CTE of approximately 3 for silicon). The thermally conductive substrate 104 has a CTE closer to the CTE of the die 110 compared with directly coupled copper heat spreaders. Consequently, the thermally conductive substrate 104 mitigates or avoids mechanical stress to the die and resulting die cracking during thermal cycling or surface mount processing. In one example, the substrate 104 is an aluminum nitride ceramic material with a CTE of approximately 4 to 5, which is relatively close to the CTE of a semiconductor substrate of the die 110.

Figure 3:
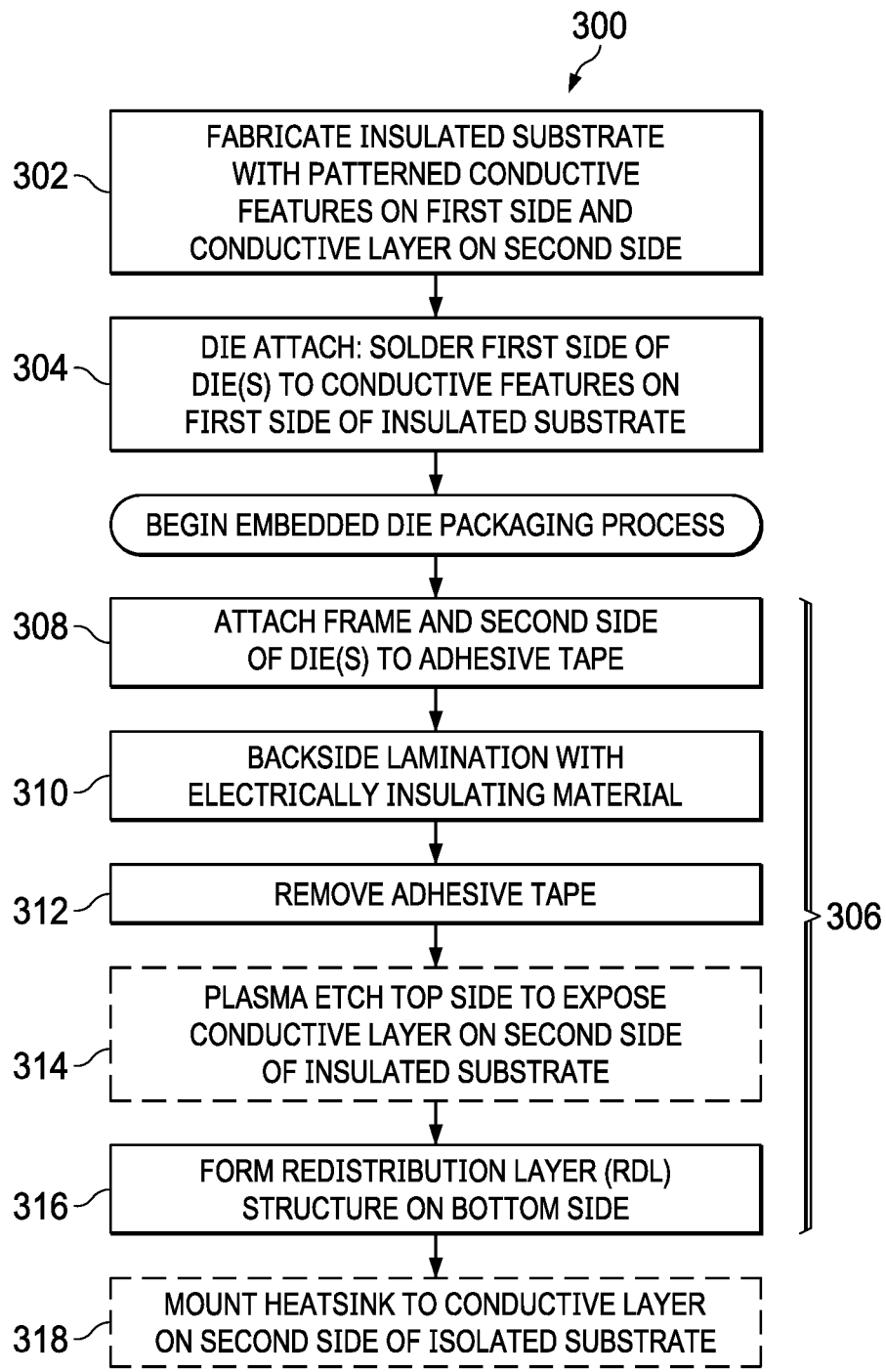
FIG. 3 is a flow diagram of a method of fabricating a packaged microelectronic device.
Figure 4:
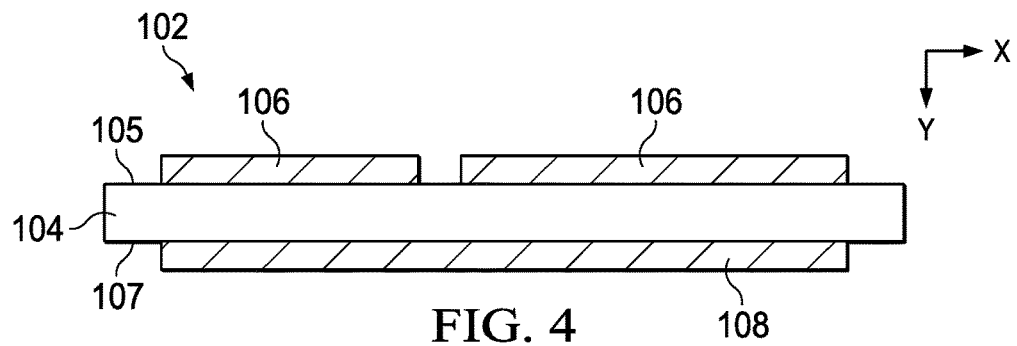
FIGS. 4-12 are partial sectional side elevation and top plan views of a microelectronic device undergoing fabrication processing according to the method of FIG. 3.

FIG. 3 shows a process or method 300 for fabricating a packaged electronic device. The method 300 can be used in one implementation to fabricate the devices 100, 200 described above. The method 300 includes fabricating an electrically insulating, thermally conducting substrate at 302. The fabrication at 302 includes forming one or more patterned conductive features on a first side of the substrate, and forming a conductive layer on the second side of the substrate. Any suitable fabrication processing can be used at 302, for example, direct bonded copper (DBC) substrate processing, insulated metal substrate (IMS) processing, direct bonded aluminum (DBA) processing, etc. FIG. 4 shows an example of a thermal transfer structure 102 fabricated at 302 in FIG. 3. The structure 102 in FIG. 4 includes a ceramic substrate 104 with an upper first side 105 and a lower second side 107. The structure 102 includes one or more conductive features 106 (e.g., plated and patterned copper conductors) on the first side 105, as well as plated and patterned copper 108 that provides an electrically conductive layer on the second side 107 of the substrate 104. In other examples, the conductive features 106 and 108 can be aluminum, and may be fabricated by plating or deposition, followed by patterning, direct bonding, or other fabrication techniques. The conductive feature or features 106 in one example provide active connections for circuitry. In this example, the electrically conductive layer 108 provides interconnection for thermal management components, such as heat sinks, to draw heat away from a connected die.

Figure 5:
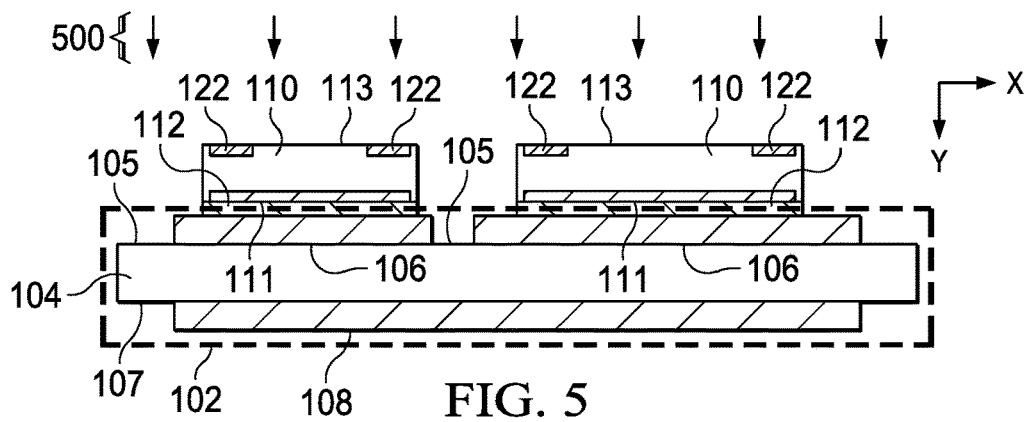
Figure 6:
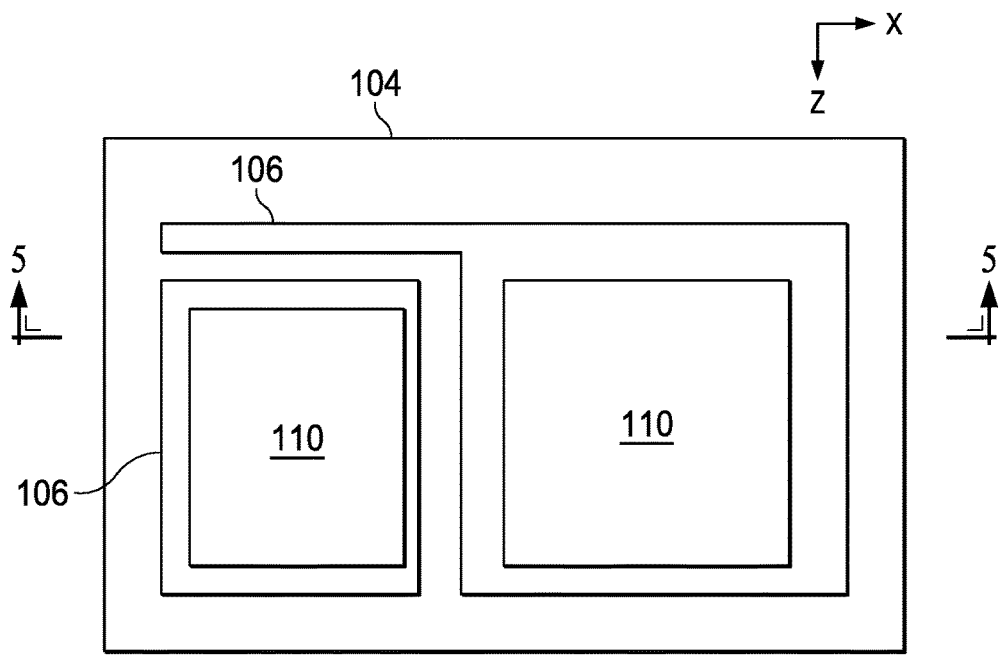

The method 300 further includes die attach processing at 304 in FIG. 3 that attaches a semiconductor die 110 to a conductive feature 106 on an electrically insulating substrate 104. FIG. 5 illustrates one example in which a surface mount soldering process 500 is performed, which attaches first and second die structures 110 to corresponding conductive features 106 on the first side 105 of the substrate 104. FIG. 6 shows a top view of the structure with the dies 110 soldered to the conductive features 106 of the substrate 104. The example processing in FIG. 5 includes performing a surface mount soldering process 500 that solders conductive features on the first side 111 of the dies 110 to the conductive features 106 on the first side 105 of the substrate 104. In one example, the surface mount attachment process 500 reflows solder 112 to form an electrical connection between the conductive structures of the dies 110 and the conductive features 106 of the substrate 104.

Figure 7:
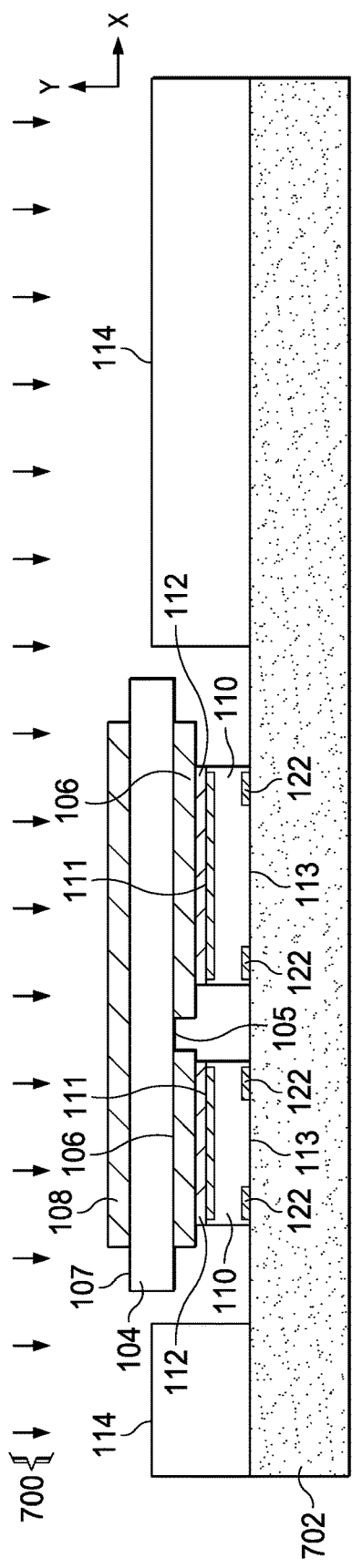

The process 300 continues in FIG. 3 with an embedded die packaging process at 306, using the insulated substrate 104 and the attached die or dies 110. The embedded die packaging process 306 includes attaching a frame and the second sides 113 of the dies 110 to a carrier at 308. FIG. 7 shows an example that includes performing a pick and place attachment process 700 that attaches the frame 114 and the dies 110 to an adhesive tape carrier 702 (e.g., tacky tape). In one implementation, the attachment includes flip attaching of the die or dies 110 and tacky tape carrier 702 in a cavity of the frame 114.

Figure 8:
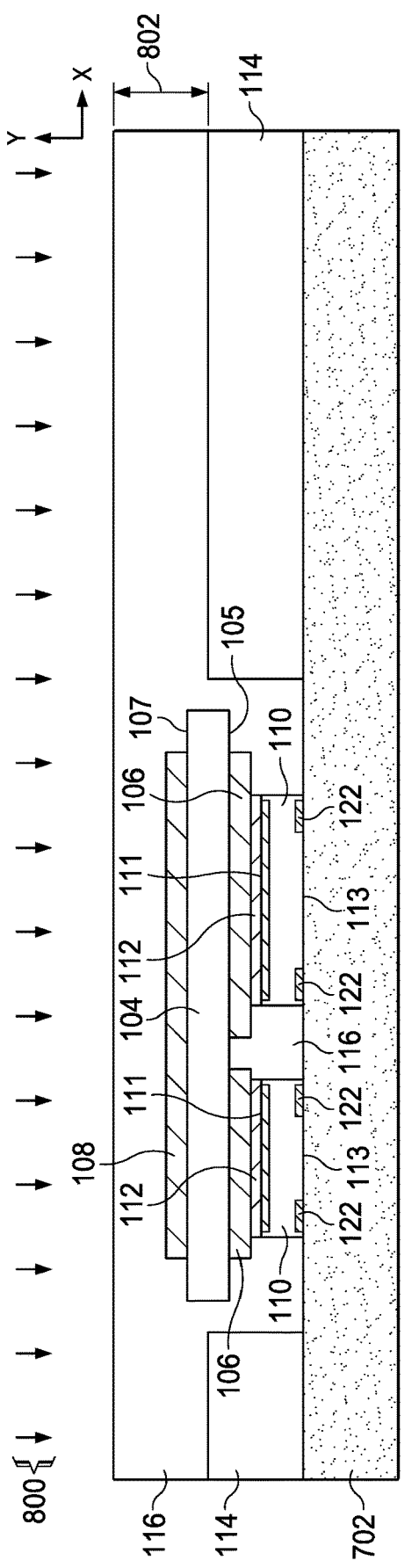

At 310 in FIG. 3, the process further includes forming an electrically insulating lamination structure to enclose a portion of the semiconductor die, a portion of the frame, and a portion of the electrically insulating substrate 104. FIG. 8 illustrates one example in which a lamination process 800 is performed, which forms the electrically insulating lamination structure 116 that at least partially encloses a portion of the semiconductor die 110, a portion of the frame 114, and a portion of the substrate 104. In one example, the electrically insulating lamination structure 116 is laminated over the dies 110 on the carrier 702 using vacuum deposition such that it reflows in and around each of the dies 110 and fills all the interstitial spaces. This layer 116 flows in and around the interconnect pads 106 and 111 and concurrently embeds the dies 110 after the flip chip attachment to the carrier 702 to permanently bond the dies 110 within the embedded die structure. In one example, the processing 800 covers the top side 107 of the substrate 104 and the electrically conductive layer 108 as shown in FIG. 8, where the electrically insulating lamination structure 116 extends to a non-zero thickness 802 above the frame 114.

Figure 9:
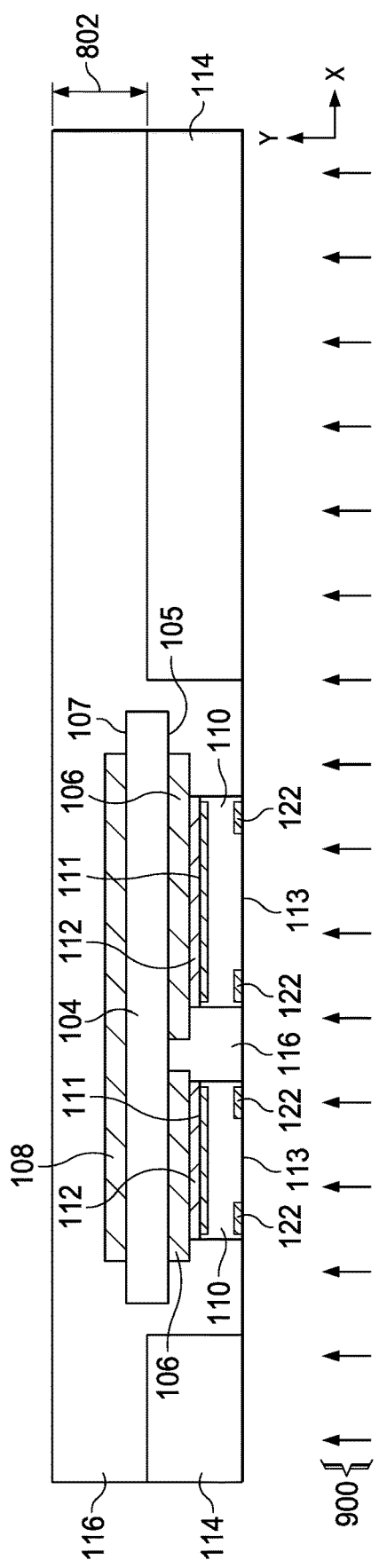
Figure 10:
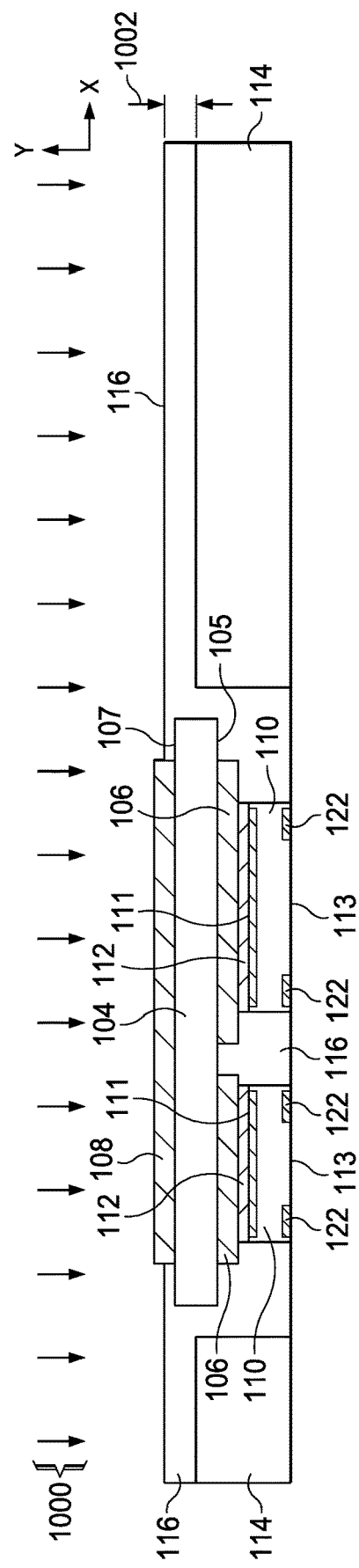

A removal process 900 is performed as shown in FIG. 9, which removes the adhesive tape carrier structure 702 at 312 in FIG. 3 after forming the electrically insulating lamination structure 116. In one example, the method 300 further includes removing a portion of the top side of the lamination structure 116 at 314. FIG. 10 shows one example including performing a plasma etch process 1000 that removes a portion of the top side of the lamination structure 116 to expose the electrically conductive layer 108 on the top side 107 of the substrate 104. In the illustrated example, the plasma etch process 1000 removes a portion of the lamination structure 116 to leave the structure 116 with a thickness 1002 above the frame 114 as shown in FIG. 10. In other examples, the plasma etch removal processing at 314 is omitted, for example, where no extra heat sink structure is to be used or where the lamination structure 116 is initially formed to a thickness that exposes the top of the electrically conductive layer 108 on the top side 107 of the substrate 104.

In one example, the removal of the adhesive tape carrier at 312 (or any included plasma etching at 314) completes the embedded die packaging processing 306, and the packaged device 100 as shown in FIG. 9 and/or 10 is ready for installation on a user circuit board (not shown). In this implementation, the electrically conductive contact structures 122 of the dies 110 are exposed and extend outward from the bottom of the device structure as shown in FIGS. 9 and 10.

Figure 11:
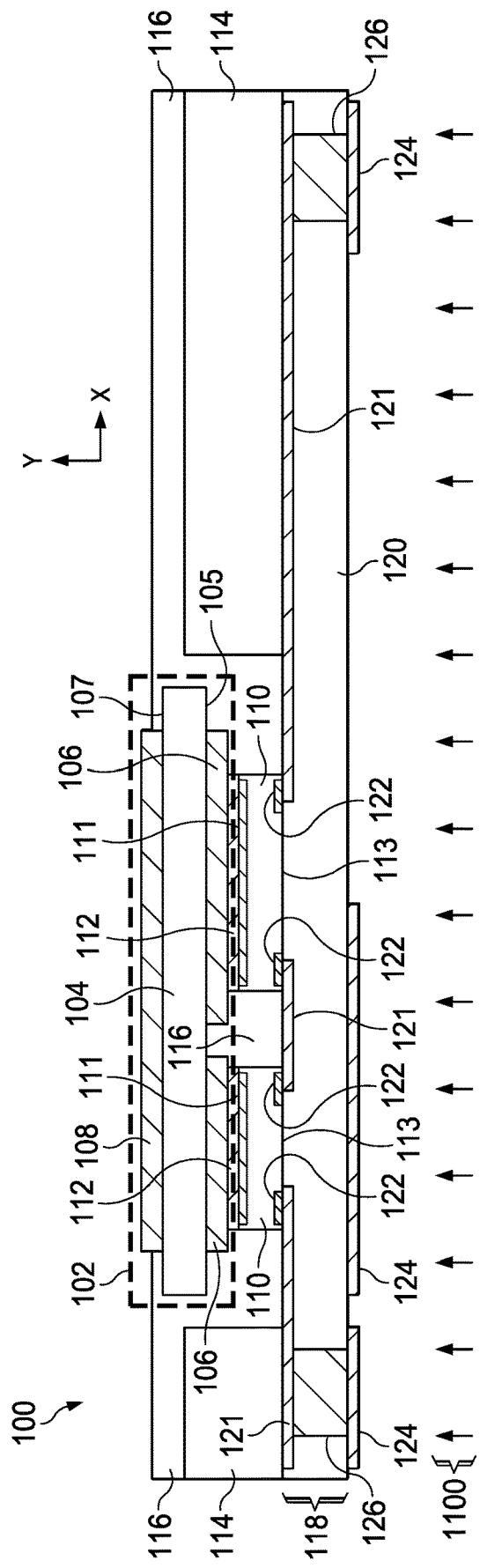

In another example, the process 300 further includes forming a redistribution layer (RDL) structure at 316 as part of the die packaging processing 306. FIG. 11 shows an example in which a process 1100 is performed, which forms the RDL structure 118 to provide external electrical connectivity of the conductive contact structures 122 of the semiconductor dies 110. The example RDL structure 118 includes a conductive structure formed by the patterned plated copper structures 121, 124, 126 that are electrically connected to the contact structures 122 of the semiconductor die 110. In one example, the RDL structure formation at 316 includes performing one or more plating processes 1100 that plate or otherwise deposit copper trace structures 121 on the bottom of the structure shown in FIG. 10. In one example, the structures 121 are plated using a plating process 1100 that uses the conductive contact structures 122 of the semiconductor dies 110 is a controversy layer to begin the plating process to form the trace structures 121. A damascene or other deposition process is then used to form me copper via structures 126, at least partially in contact with one or more of the plated copper trace structures 121. The RDL fabrication processing 1100 in this example further includes deposition or application of a buildup material (e.g., isolation material) 121, followed by plating or other deposition of the second copper trace structures 124 on the bottom of the structure as shown in FIGS. 11 and 1. This example provides exposed lower conductive features 124 of the RDL structure 118, which extend downward from the substrate 120 to allow soldering to a user circuit board (not shown).

Figure 12:
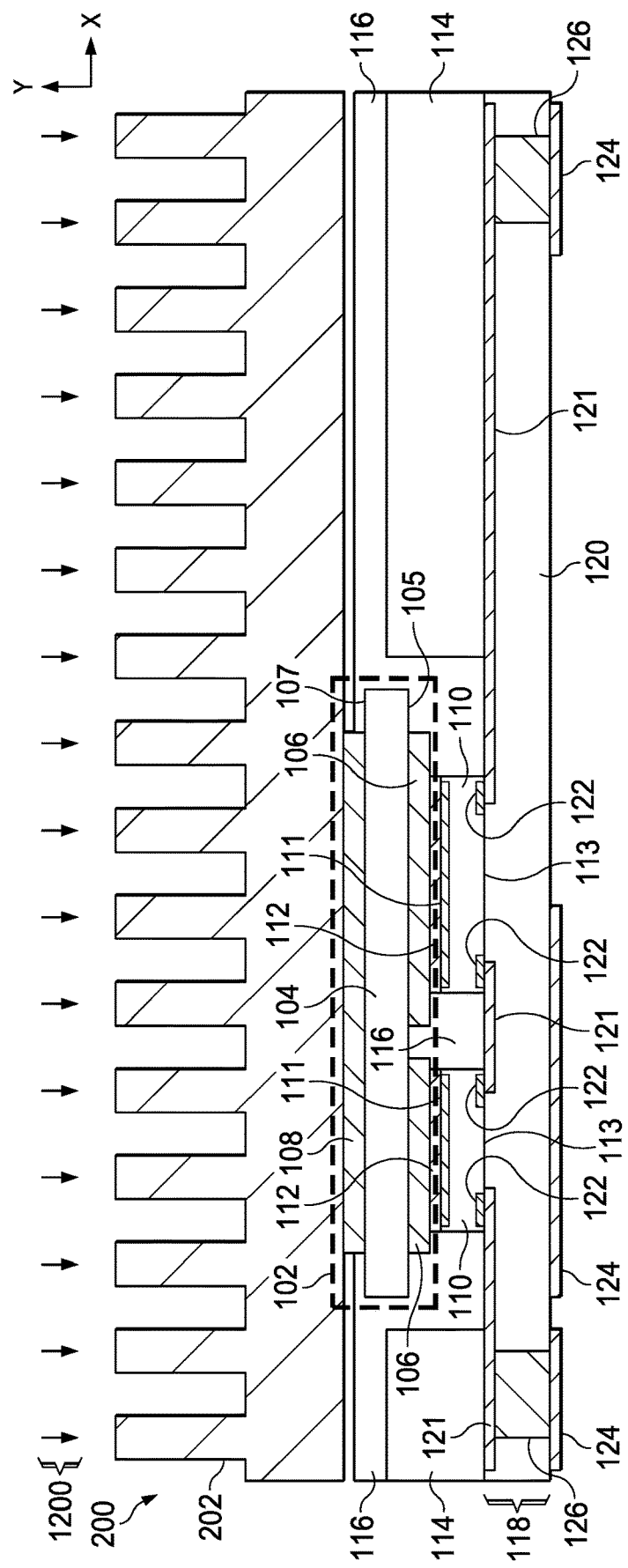

Referring also to FIG. 12, in certain examples, the method 300 also includes mounting a heat sink to the substrate 104 at 318 to the electrically conductive layer 108 of the thermal transfer structure 102. FIG. 12 illustrates one example packaged electronic device 200. In this example, a heat sink attachment process 1200 is performed, which attaches a heat sink structure 202 to an exposed portion of the electrically conductive layer 108 of the top side 107 of the substrate 104. The example of FIG. 12 includes the RDL structure 118. In other implementations, the RDL structure 118 can be omitted.

Figure 13:
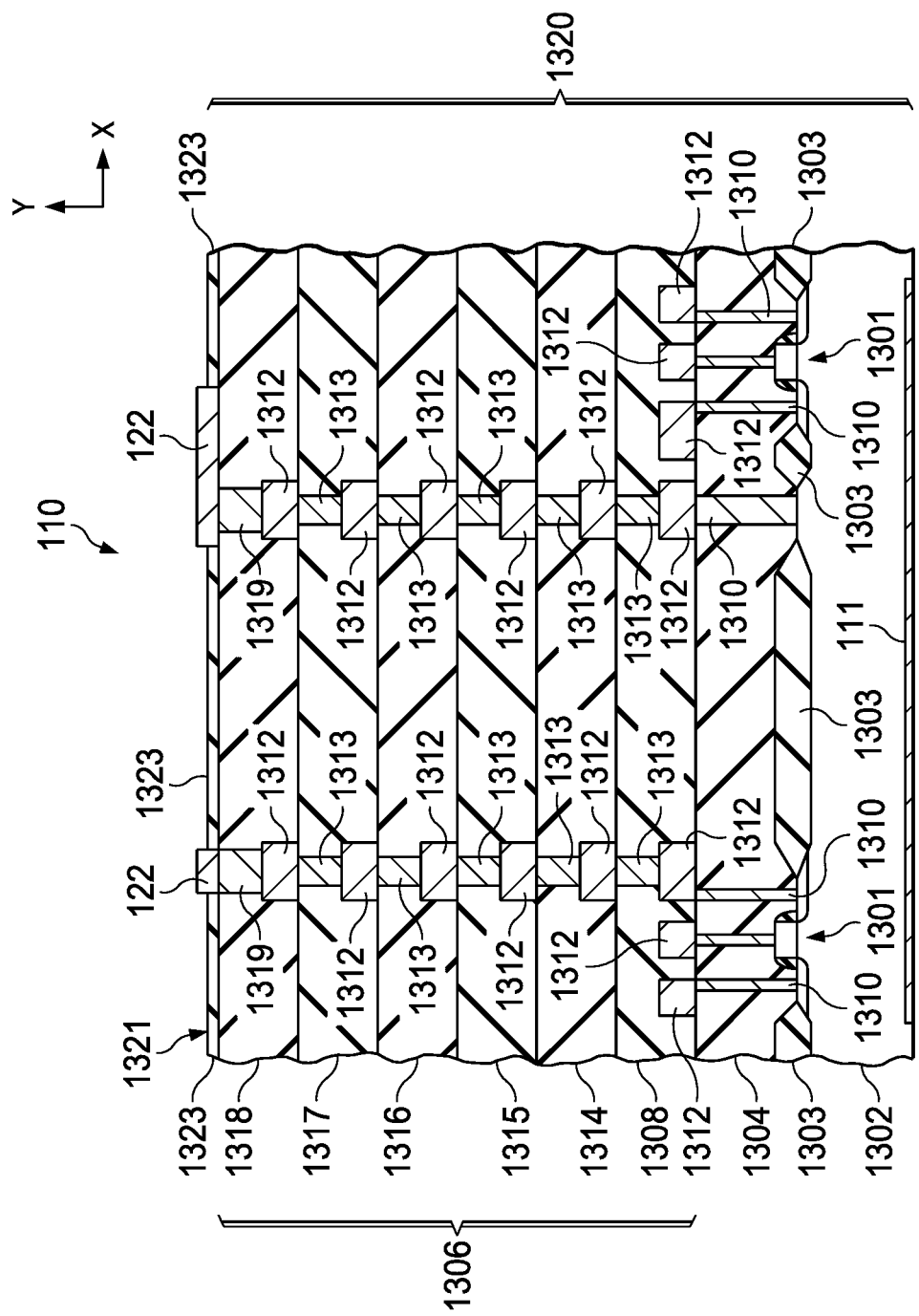
FIG. 13 is a partial sectional side elevation view of an example semiconductor die in the packaged microelectronic devices of FIGS. 1 and 2.

FIG. 13 shows further details of an example semiconductor die 110 in the packaged microelectronic devices 100, 200 of FIGS. 1 and 2. The example die 110 of FIG. 13 includes multiple electronic components 1301 (e.g., metal oxide semiconductor (MOS) transistors) disposed on or in a semiconductor substrate 1302. Although the example die 110 is an integrated circuit with multiple components 1301, other microelectronic device implementations can include a single electronic component. The semiconductor substrate 1302 in one example is a silicon wafer, a silicon-on-insulator (SOI) substrate or other semiconductor structure. Isolation structures 1303 are disposed on select portions of an upper surface or side of the substrate 1302. The isolation structures 1303 can be shallow trench isolation (STI) features or field oxide (FOX) structures in some examples. The die 110 also includes a multi-layer metallization structure 1304, 1306 disposed above the substrate 1302. The metallization structure includes a first dielectric structure layer 1304 formed over the substrate 1302, as well as a multi-level upper metallization structure 1306. In one example, the first dielectric 1304 structure layer is a pre-metal dielectric (PMD) layer disposed over the components 1301 and the upper surface of the substrate 1302. In one example, the first dielectric structure layer 1304 includes silicon dioxide ($SiO_2$) deposited over the components 1301, the substrate 1302 and the isolation structures 1303.

The example die 110 of FIG. 13 includes a 6 layer upper metallization structure 1306 with a first layer 1308, referred to herein as an interlayer or interlevel dielectric (ILD) layer. Different numbers of layers can be used in different implementations. In one example, the first ILD layer 1308, and the other ILD layers of the upper metallization structure 1306 are formed of silicon dioxide ($SiO_2$) or other suitable dielectric material. In certain implementations, the individual layers of the multi-layer upper metallization structure 1306 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials. Tungsten or other conductive contacts 1310 extend through selective portions of the first dielectric structure layer 1304. The first ILD layer 1308, and the subsequent ILD layers in the upper metallization structure 1306 include conductive metallization interconnect structures 1312, such as aluminum formed on the top surface of the underlying layer. In this example, the first layer 1308 and the subsequent ILD layers also include conductive vias 1313, such as tungsten, providing electrical connection from the metallization features 1312 of an individual layer to an overlying metallization layer. The example of FIG. 13 includes a second layer 1314 disposed over the first layer 1308. The ILD layer 1308 includes conductive interconnect structures 1312 and vias 1313. The illustrated structure includes further metallization levels with corresponding dielectric layers 1315, 1316 and 1317, as well as an uppermost or top metallization layer 1318. The individual layers 1315-1318 in this example include conductive interconnect structures 1312 and associated vias 1313. The substrate 1302, the electronic components 1301, the first dielectric structure layer 1304 and the upper metallization structure 1306 form a wafer or die 1320 with an upper side or surface 1321. The upper side 1321 of the metallization structure 1306 in one example forms an upper side of the wafer or die 1320.

The top metallization layer 1318 includes two example conductive features 1319, such as upper most aluminum vias. The conductive features 1319 include a side or surface at the upper side 1321 of the wafer or die 1320 at the top of the uppermost metallization layer 1318. Any number of conductive features 1319 may be provided. One or more of the conductive features 1319 can be electrically coupled with an electronic component 1301. The upper ILD dielectric layer 1318 in one example is covered by one or more passivation layers 1323 (e.g., protective overcoat (PO) and/ or passivation layers), for example, silicon nitride (SiN), silicon oxynitride ($SiO_xN_y$), or silicon dioxide ($SiO_2$). In one example, the passivation layer or layers 1323 include one or more openings that expose a portion of the conductive features 1319 to allow electrical connection of the features 1319 to corresponding contact structures.

In the example of FIG. 13, the die 110 includes two conductive contact structures 122. The contact structures 122 extend outward (e.g., upward along the "Y" direction in FIG. 13) from the upper side 1321 of the metallization structure 1306. The individual contact structures 122 are electrically coupled with a corresponding one of the conductive features 1319. The individual contact structures 122 in one example include a conductive seed layer, such as copper that extends outward from the upper side 1321 of the metallization structure 1306. In one example, the contact structure 122 includes titanium (Ti) or titanium tungsten (TiW).

Disclosed examples provide low stress, thermally enhanced and electrically isolated packaging techniques and packaged electronic device apparatus, with particular benefits for high power, stress sensitive packaging, such as gallium nitride (GaN) dies 110 having high power density and Piezo-electric characteristics. Disclosed examples facilitate thermally conductive heat flow paths from one or more semiconductor dies 110 to the top side of the package, whether including a top-mounted heat sink or not, while keeping low mechanical stress at the dies 110 and facilitating low parasitic inductance by the use of RDL structures 118 in certain examples. Ceramic substrates and other electrically insulating, thermally conductive thermal transfer structures 102 provide good CTE matching with silicon, gallium nitride or other semiconductor die structures 110, which help to reduce mechanical stress at the die/substrate interface. Prior techniques have not attempted to integrate ceramic substrates into embedded package fabrication processes, and instead use arrays copper vias to alleviate mechanical stress to die (e.g., GaN Systems). However, such as via arrays add significant cost and complexity to a fabrication process flow. Disclosed examples provide improved thermal performance, which can include thick copper layers on ceramic substrates to provide beneficial thermal transfer structures 102 to facilitate dissipation of heat while providing electrical isolation for top side heat sink features. The disclosed solutions do not require separate thermal interface material (TIM) for heat sink attachment, and allow mounting of multiple die structures 110 under a single shared heat sink (e.g., half-bridge, full-bridge, etc.). The disclosed examples provide solutions that are scalable to multi-phase leg architectures in power conversion circuitry, for example, including formation of multi-phase leg circuits on a ceramic substrate for power module applications. Disclosed examples for the provide integration of ceramic substrates with multi-phase legs in easily manufactured embedded packaging process flows, together with significant die stress reduction.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A packaged electronic device, comprising:
   a thermal transfer structure, including an electrically insulating, thermally conductive substrate with an electrically conductive feature;
   a semiconductor die mounted to the electrically conductive feature of the electrically insulating, thermally conductive substrate, the semiconductor die including an electrically conductive contact structure, and an electronic component electrically connected to the electrically conductive contact structure;
   an electrically insulating frame, and
   an electrically insulating lamination structure enclosing a portion of the semiconductor die, a portion of the electrically insulating frame, and a portion of the thermal transfer structure.

2. The packaged electronic device of claim 1, wherein the electrically insulating substrate includes a ceramic material.

3. The packaged electronic device of claim 2, wherein the electrically insulating substrate includes aluminum oxide, aluminum nitride, silicon nitride, fired or sintered zirconia ceramic, or zirconia toughened alumina.

4. The packaged electronic device of claim 2, further comprising a redistribution layer (RDL) structure with a conductive structure electrically connected to the electrically conductive contact structure.

5. The packaged electronic device of claim 4, further comprising a heat sink mounted to an electrically conductive layer of the thermal transfer structure.

6. The packaged electronic device of claim 2, further comprising a heat sink mounted to an electrically conductive layer of the thermal transfer structure.

7. The packaged electronic device of claim 1, further comprising a redistribution layer (RDL) structure with a conductive structure electrically connected to the electrically conductive contact structure.

8. The packaged electronic device of claim 7, further comprising a heat sink mounted to an electrically conductive layer of the thermal transfer structure.

9. The packaged electronic device of claim 1, further comprising a heat sink mounted to an electrically conductive layer of the thermal transfer structure.

10. The packaged electronic device of claim 1, wherein the semiconductor die includes:
- a semiconductor substrate, wherein the electronic component is disposed on or in the semiconductor substrate; and
- a metallization structure disposed over the semiconductor substrate, wherein the conductive structure extends outward from the metallization structure.

11. An integrated circuit (IC), comprising:
- a thermal transfer structure, including an electrically insulating, thermally conductive substrate with an electrically conductive feature;
- a semiconductor die mounted to the electrically conductive feature of the electrically insulating, thermally conductive substrate, the semiconductor die including an electrically conductive contact structure, and an electronic component electrically connected to the electrically conductive contact structure;
- an electrically insulating lamination structure enclosing a portion of the semiconductor die and a portion of the thermal transfer structure; and
- a redistribution layer (RDL) structure with a conductive structure electrically connected to the electrically conductive contact structure.

12. The IC of claim 11, further comprising a heat sink mounted to an electrically conductive layer of the thermal transfer structure.

13. The IC of claim 11, wherein the electrically insulating, thermally conductive substrate includes a ceramic material.

14. A packaged electronic device, comprising:
- a thermal transfer structure, including an electrically insulating, thermally conductive substrate with an electrically conductive feature, wherein the electrically insulating substrate includes a ceramic material;
- a semiconductor die mounted to the electrically conductive feature of the electrically insulating, thermally conductive substrate, the semiconductor die including an electrically conductive contact structure, and an electronic component electrically connected to the electrically conductive contact structure;
- a redistribution layer (RDL) structure with a conductive structure directly connected to the electrically conductive contact structure; and
- an electrically insulating lamination structure enclosing a portion of the semiconductor die and a portion of the thermal transfer structure.

15. The packaged electronic device of claim 14, further comprising a heat sink mounted to an electrically conductive layer of the thermal transfer structure.

16. A packaged electronic device, comprising:
- a thermal transfer structure, including an electrically insulating, thermally conductive substrate with an electrically conductive feature;
- a semiconductor die mounted to the electrically conductive feature of the electrically insulating, thermally conductive substrate, the semiconductor die including an electrically conductive contact structure, and an electronic component electrically connected to the electrically conductive contact structure;
- a redistribution layer (RDL) structure with a conductive structure directly connected to the electrically conductive contact structure; and
- an electrically insulating lamination structure enclosing a portion of the semiconductor die and a portion of the thermal transfer structure.

17. The packaged electronic device of claim 16, further comprising a heat sink mounted to an electrically conductive layer of the thermal transfer structure.

18. An integrated circuit (IC), comprising:
- a thermal transfer structure, including an electrically insulating, thermally conductive substrate with an electrically conductive feature;
- a semiconductor die mounted to the electrically conductive feature of the electrically insulating, thermally conductive substrate, the semiconductor die including an electrically conductive contact structure, and an electronic component electrically connected to the electrically conductive contact structure;
- a frame, at least a portion of the semiconductor die positioned within a cavity in the frame; and
- an electrically insulating lamination structure enclosing a portion of the semiconductor die, a portion of the frame, and a portion of the thermal transfer structure.

19. The IC of claim 18, further comprising a heat sink mounted to an electrically conductive layer of the thermal transfer structure.

20. The IC of claim 18, wherein the electrically insulating, thermally conductive substrate includes a ceramic material.

21. The IC of claim 18, wherein the electrically insulating lamination structure enclosed a portion of the semiconductor die and a portion of the thermal transfer structure.

22. The IC of claim 18, wherein at least a portion of the thermal transfer structure is within the cavity.

* * * * *